United States Patent
Bashar

(10) Patent No.: US 9,217,780 B2
(45) Date of Patent: Dec. 22, 2015

(54) COMPENSATION TECHNIQUE FOR AMPLIFIERS IN A CURRENT SENSING CIRCUIT FOR A BATTERY

(71) Applicant: QUALCOMM Incorporated, San Diego, CA (US)

(72) Inventor: Aniruddha Bashar, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 214 days.

(21) Appl. No.: 14/149,739

(22) Filed: Jan. 7, 2014

(65) Prior Publication Data

US 2015/0192642 A1    Jul. 9, 2015

(51) Int. Cl.
  H02J 7/00    (2006.01)
  H02J 7/14    (2006.01)
  G01R 31/36   (2006.01)
  H03F 3/45    (2006.01)
  G01R 19/00   (2006.01)
  G01R 19/32   (2006.01)

(52) U.S. Cl.
  CPC ........ *G01R 31/3624* (2013.01); *G01R 19/0046* (2013.01); *G01R 19/32* (2013.01); *G01R 31/3655* (2013.01); *H03F 3/45179* (2013.01); *H03F 3/45475* (2013.01); *H03F 2203/45048* (2013.01); *H03F 2203/45138* (2013.01)

(58) Field of Classification Search
  USPC ............ 320/104, 132, 140, 164, 166; 307/43; 323/285, 315, 316; 327/105
  See application file for complete search history.

(56) References Cited

U.S. PATENT DOCUMENTS

| | | |
|---|---|---|
| 5,498,984 A | 3/1996 | Schaffer |
| 5,945,853 A | 8/1999 | Sano |
| 8,476,890 B2 | 7/2013 | Adkins et al. |
| 8,525,497 B2 | 9/2013 | Chiu et al. |
| 8,901,891 B2 * | 12/2014 | Inoue ..................... G01R 19/14 320/132 |
| 2002/0180418 A1 | 12/2002 | Jones et al. |
| 2009/0137211 A1 * | 5/2009 | Stengel .............. H03K 5/15013 455/76 |
| 2012/0249243 A1 | 10/2012 | Rosca |
| 2013/0009655 A1 * | 1/2013 | Marten ................ G01R 15/146 324/713 |
| 2013/0033309 A1 | 2/2013 | Choi |

(Continued)

FOREIGN PATENT DOCUMENTS

WO    2012117275 A2    9/2012

OTHER PUBLICATIONS

International Search Report and Written Opinion—PCT/US2015/010529—ISA/EPO—Apr. 2, 2015.

*Primary Examiner* — Edward Tso
*Assistant Examiner* — Alexis A Boateng
(74) *Attorney, Agent, or Firm* — Fountainhead Law Group P.C.

(57) ABSTRACT

In one embodiment, a circuit includes a first amplifier having a first differential input, a second differential input, and an output. The replica device is configured to generate a replica current of a current flowing through the battery where the first amplifier controls the control device to control the replica current. The circuit also includes a second amplifier having a third differential input, a fourth differential input, and an output. The second amplifier is configured to compensate for a first offset error of the first amplifier and a second offset error of the second amplifier based on selectively coupling the third differential input to the output of the first amplifier during a first phase, selectively coupling the output of the second amplifier to the second differential input during the first phase, and selectively coupling the output of the second amplifier to the fourth differential input during a second phase.

20 Claims, 10 Drawing Sheets

(56) References Cited

U.S. PATENT DOCUMENTS

| | | | |
|---|---|---|---|
| 2013/0120027 A1* | 5/2013 | Inoue | H03F 3/45192 327/82 |
| 2013/0134988 A1* | 5/2013 | Pulijala | H03F 3/45183 324/601 |
| 2015/0022241 A1* | 1/2015 | Ariyama | G01R 33/07 327/76 |
| 2015/0040687 A1* | 2/2015 | Ariyama | G01R 33/07 73/862.381 |
| 2015/0145588 A1* | 5/2015 | Chao | G05F 3/262 327/513 |

\* cited by examiner

COMPENSATION TECHNIQUE FOR AMPLIFIERS IN A CURRENT SENSING CIRCUIT FOR A BATTERY

BACKGROUND

Battery operated systems require accurate measurement of current flowing into and out of the system during charging and discharging of the battery. FIG. 1 shows an example of a battery monitoring system or fuel gauge system. Battery current flows between a system node VSYS and a battery terminal VBATT through a main transistor (e.g., a transistor BATFET). One technique for measuring the battery current is to use replica devices (e.g., replica transistors Replica1 and Replica2) in parallel with the main transistor BATFET. The replica transistors Replica1 and Replica2 produce replica currents (e.g., a charging current $I_{CHARGE}$ and a discharge current $I_{DISCHARGE}$) that are a scaled down version of the battery current. The charging current $I_{CHARGE}$ and the discharge current $I_{DISCHARGE}$ flow through sensing resistors R1 and R2, respectively. An analog to digital converter (ADC) samples the voltage across resistors R1 and R2 to determine the charge across the battery. The battery monitoring system then uses the output of the ADC to monitor the battery.

For accuracy, it is important to control the voltage across control transistors M1 and M2 for the replica device. The system may use a feedback loop to control the voltage. For example, amplifiers AMP1 and AMP2 control the voltage across control transistors M1 and M2, respectively. In this case, the inputs of amplifier AMP1 are coupled to the system node VSYS and the gate and source of replica transistor Replica2 and the output is coupled to a control transistor M1. Also, the inputs of amplifier AMP2 are coupled to the system node VBATT and the drain of replica transistor Replica1 and the output is coupled to a control transistor M2. Amplifiers AMP1 and AMP2 control the voltage at the gate of control transistors M1 and M2, respectively, to produce the replica currents. One problem with this approach is that offset error within each amplifier may cause errors in the replica currents. Also, the resistor used to measure the voltage can cause errors across process and temperature variations.

SUMMARY

In one embodiment, a circuit includes a first amplifier having a first differential input, a second differential input, and an output. The first differential input is coupled to a replica device and a voltage of a battery and the output is coupled to a control device. The replica device is configured to generate a replica current of a current flowing through the battery where the first amplifier controls the control device to control the replica current. The circuit also includes a second amplifier having a third differential input, a fourth differential input, and an output. The second amplifier is configured to compensate for a first offset error of the first amplifier and a second offset error of the second amplifier based on selectively coupling the third differential input to the output of the first amplifier during a first phase, selectively coupling the output of the second amplifier to the second differential input during the first phase, and selectively coupling the output of the second amplifier to the fourth differential input during a second phase.

In one embodiment, during the second phase, the second amplifier stores the second offset error of the second amplifier on a first set of storage elements coupled to the fourth differential input of the second amplifier for use in compensating for the second offset error of the second amplifier during the first phase.

In one embodiment, during the first phase, the second amplifier stores the first offset error of the first amplifier on a second set of storage elements coupled to the second differential input of the first amplifier for use in compensating for the first offset error of the first amplifier during a subsequent second phase.

In one embodiment, a gain of the second amplifier is used to compensate for the first offset error during the first phase.

In one embodiment, the output of the second amplifier is a differential output, and the circuit further includes a common mode feedback circuit coupled to the differential output and configured to maintain a common mode portion of the differential output at a fixed value different from the voltage of the battery.

In one embodiment, the circuit further includes a resistor configured to receive the replica current, wherein a voltage across the resistor is sensed to monitor the voltage across the battery.

In one embodiment, a method includes: during a first phase, storing, by a second amplifier, a first offset error of a first amplifier on a first set of storage elements coupled to a differential input of the first amplifier for use in compensating for the first offset error of the first amplifier during a second phase; during the second phase, storing, by the second amplifier, a second offset error of the second amplifier on a second set of storage elements coupled to a differential input of the second amplifier for use in compensating for the second offset error of the second amplifier during a subsequent first phase; during the second phase, controlling, by the first amplifier, a control device to control a replica current generated by the replica device, the replica current being a replica of a current flowing through the battery, wherein the first offset error is compensated for using the first offset error stored during the first phase; and during the subsequent first phase, controlling, by the first amplifier, the control device to control the replica current, wherein a gain of the second amplifier is used to compensate for the first offset error and the second offset error is compensated for using the second offset error stored during the second phase.

The following detailed description and accompanying drawings provide a better understanding of the nature and advantages of the present disclosure.

DETAILED DESCRIPTION

The present disclosure pertains to battery monitoring system. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
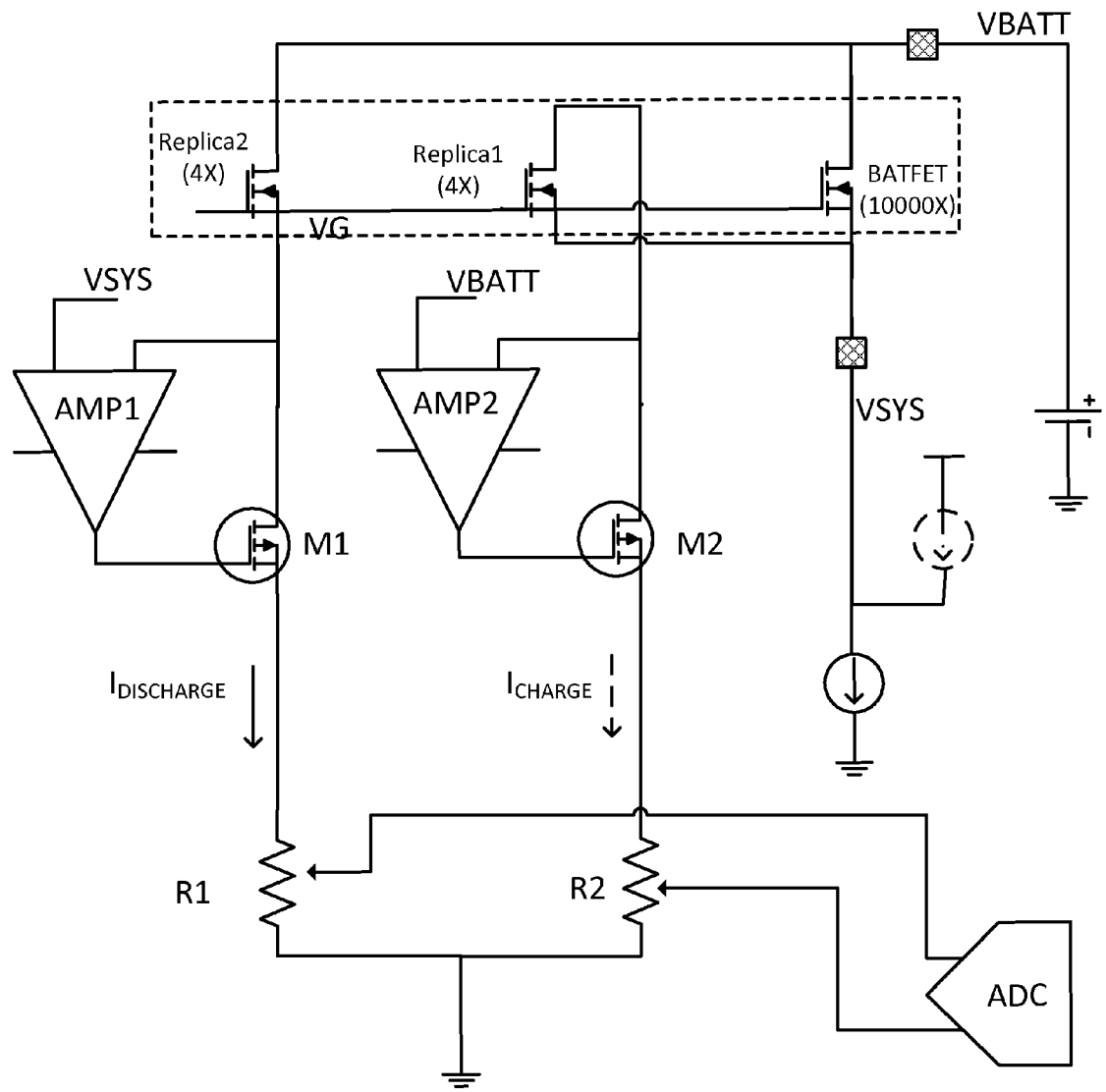
FIG. 1 shows an example of a battery monitoring system or fuel gauge system.
Figure 2:
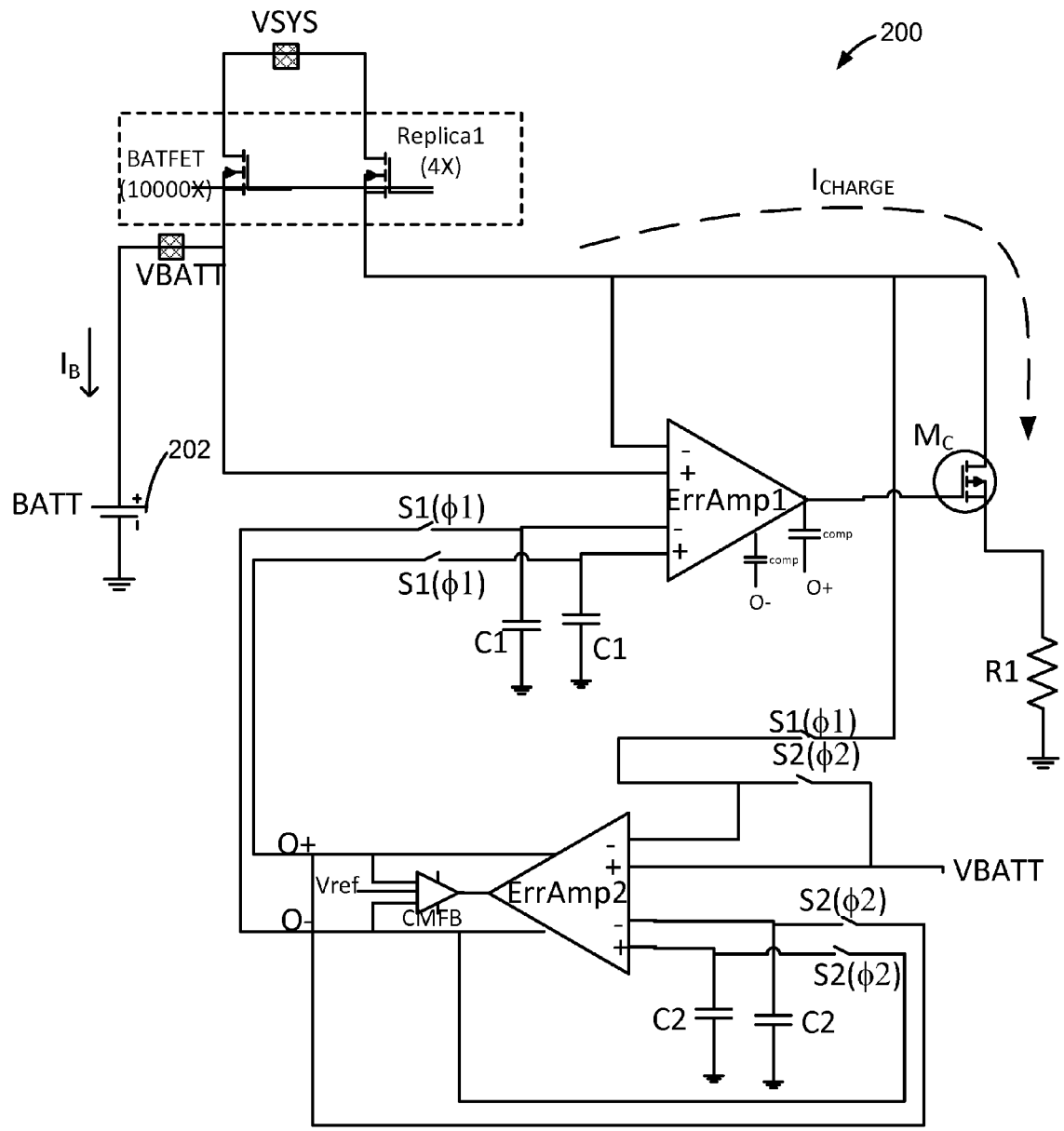
FIG. 2 depicts an example of a battery monitoring system according to one embodiment.

FIG. 2 depicts an example of a battery monitoring system 200 according to one embodiment. Battery monitoring system 200 may monitor battery currents (e.g., discharging and charging currents) for a battery (BATT) 202 flowing through a transistor BATFET from a node VSYS to a node VBATT. In FIG. 2, only the charging current is shown, but a person skilled in the art will appreciate how to implement the battery monitoring system to monitor the discharging current.

Battery monitoring system 200 may monitor the battery current using an internal (e.g., on chip) current-sensing resistor $R_1$. Although an internal resistor is discussed, external (e.g., off chip) resistors may be used. System 200 uses a replica transistor Replica1 to generate a replica current of a battery current $I_B$ that flows through battery transistor BATFET and battery 202 through a node VBATT. In one embodiment, transistors BATFET and replica1 may be N-channel MOSFET devices with their gate and sources coupled together. As shown, the replica current $I_{CHARGE}$ flows through transistor Replica1 and may be a scaled-down version of the battery current $I_B$.

Amplifiers ErrAmp1 and ErrAmp2 form a feedback loop that controls the voltage across a replica device, such as a control transistor M, which operates in different operating regions (saturation or linear) depending on the mode of operation of a linear charger for battery 202. In one embodiment, amplifier ErrAmp1 controls a gate voltage of control transistor $M_c$ to control the replica current $I_{CHARGE}$ through sensing resistor $R_1$. The control of control transistor $M_c$ may regulate the replica current $I_{CHARGE}$ to be proportional to the battery current $I_B$. As discussed above, an ADC (not shown) may measure the voltage across sensing resistor $R_1$, where the output of the ADC is used by a battery management system or fuel gauge measurement algorithm.

As discussed above in the Background, the offset error of the amplifiers may affect the performance of battery monitoring system 200. For example, the replica current $I_{CHARGE}$ may be small and the voltage across sensing resistor $R_1$ may be as low as hundreds of microvolts. Thus, the offset error of amplifiers ErrAmp1 and ErrAmp2 may affect the measured voltage. Particular embodiments compensate for the amplifier offset error and also employ a technique to reduce the effect of temperature variations on resistor $R_1$.

In one embodiment, amplifier ErrAmp1 may include a first differential input and a second differential input along with an output coupled to transistor $M_c$. Amplifier ErrAmp2 may include a first differential input, a second differential input, and a differential output. Accordingly, amplifier ErrAmp1 and amplifier ErrAmp2 have two gain stages as will be described in more detail below. Although amplifier ErrAmp2 is described as having a differential output, amplifier ErrAmp2 may have a single output. As will be discussed in more detail below, the differential output allows system 200 the compensation to be performed at a different voltage than VBATT or a rail voltage of the system.

Amplifier ErrAmp2 may be a nulling amplifier that is used to compensate for the offset error in the main amplifier ErrAmp1. Further, Amplifier ErrAmp2 also compensates for its own offset error. As will be discussed in more detail below, the technique may be used continuously to track changes in the offset error and effectively compensate for the changes in the offset error. Thus, amplifiers ErrAmp2 and ErrAmp1 can track any shift in the offset errors due to operating conditions and compensate for the errors (e.g., null or zero the errors). Thus, the compensation may be better than a one-time compensation.

Battery monitoring system 200 may use multiple clock phases, such as a clock phase $\Phi 1$ and a clock phase $\Phi 2$, to compensate for the offset errors of amplifier ErrAmp1 and amplifier ErrAmp2. In clock phase $\Phi 1$, amplifier ErrAmp2 stores the offset error of amplifier ErrAmp1 on capacitors C1. This value will be used to compensate for the offset error of amplifier ErrAmp1 in a subsequent clock phase $\Phi 2$. Also, in clock phase $\Phi 2$, system 200 stores the offset error of amplifier ErrAmp2 on capacitors C2. This compensates for the offset error of amplifier ErrAmp2 in a subsequent clock phase $\Phi 1$ as the stored offset error makes sure the offset error of amplifier ErrAmp2 does not affect the storing of the offset error of amplifier ErrAmp1 on capacitors C1. As shown in FIG. 2, switches S1 and S2 may be open or closed based on the clock phase. For example, switches S1 are closed during clock phase $\Phi 1$ and open during clock phase $\Phi 2$, and switches S2 are closed during clock phase $\Phi 2$, and open during clock phase $\Phi 1$. The use of switches S1 and S2 couples the inputs and outputs of amplifiers ErrAmp1 and ErrAmp2 differently depending on the clock phase. These configurations will now be described in more detail.

Figure 3:
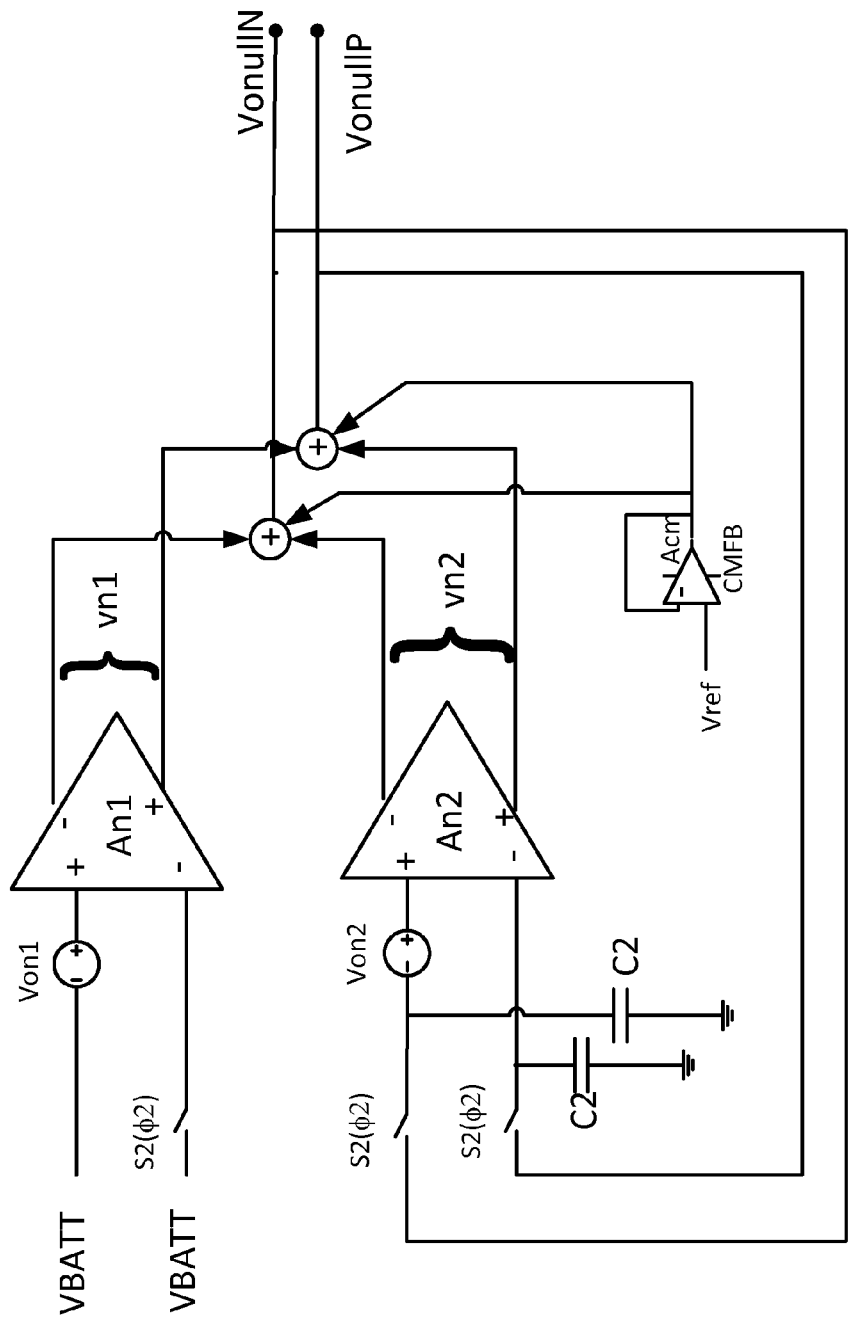
FIG. 3 depicts an example of amplifier ErrAmp2 during clock phase Φ2 according to one embodiment.

FIG. 3 depicts an example of amplifier ErrAmp2 during clock phase $\Phi 2$ according to one embodiment. In clock phase $\Phi 2$, switches S2 are closed and switches S1 are open, which isolate the input and output of amplifier ErrAmp2 from the input and output of amplifier ErrAmp1. In this case, amplifier ErrAmp2 may be in an open loop gain configuration. As discussed above, amplifier ErrAmp2 stores the offset error of amplifier ErrAmp2 on capacitors C2 during this clock phase.

Amplifier ErrAmp2 includes a first amplifier An1 and a second amplifier An2 that receive a first differential input and a second differential input, respectively. Both inputs of the differential input of amplifier An1 are coupled to battery 102. The offset error of amplifier An1 is shown as an offset error voltage Von1 at the input of one of the differential inputs.

To store the offset error of amplifier ErrAmp2, a feedback path from the output of amplifier ErrAmp2 to the differential input of amplifier An2 is used. In the feedback path, the output of amplifier ErrAmp2 (e.g., differential output VonullN and VonullP) is coupled to capacitors C2, which can store the offset error during clock phase $\Phi 2$. The offset error stored on capacitors C2 includes an inferred offset error voltage Von2 on one input of the differential input of amplifier An2 and the offset error voltage Von1.

In operation, the differential output vn1 of amplifier An1 and the differential output vn2 of amplifier An2 are added together to generate a differential output VonullN and VonullP. As will be discussed in more detail below, a common mode feedback circuit CMFB may shift the differential output calculation to a common mode voltage based on Vref. The differential output may be the combination of vn1+vn2, which reflect the offset errors Von1 and Von2. The outputs VonullN and VonullP are then stored on capacitors C2 during clock phase Φ2.

The following represents the calculation of the two control paths of the common mode and differential.

$$V_{ocm} = \frac{A_{CMFB}}{1+A_{CMFB}} V_{ref}$$

$$V_{onullP} = V_{ocm} + \frac{1}{2}(v_{n1} + v_{n2}) \quad (1)$$

$$V_{onullN} = V_{ocm} - \frac{1}{2}(v_{n1} + v_{n2}) \quad (2)$$

$$\Delta V_{onull} = V_{onullP} - V_{onullN} = (v_{n1} + v_{n2}) \quad (3)$$

$$v_{n2} = A_{n2} \times (v_{on2} - \Delta V_{onull}) \quad (4)$$

$$v_{n1} = A_{n1} \times (VBATT - VBATT + v_{on1}) \quad (5)$$

$$\Delta V_{onull} = V_{onullP} - V_{onullN} = (v_{n1} + v_{n2}) \quad (6)$$
$$= A_{n2} \times (v_{on2} - \Delta V_{onull}) + A_{n1} \times (v_{on1})$$
$$= \frac{A_{n2}}{1+A_{n2}}(v_{on2}) + \frac{A_{n1}}{1+A_{n2}}(v_{on1})$$

The voltage of the common mode amplifier Acm is based on the gain of amplifier Acm and a voltage Vref. Voltage Vref may be different from the voltage of the battery or rail, such as Vdd/2.

Equation 1 shows the calculation for output VonullP and equation 2 shows the calculation for output VonullN. In this case, output VonullP is the common mode output voltage Vocm plus half of the differential output of vn1 and vn2. Output VonullN is equal to the common mode voltage Vocm minus half of the differential output of vn1 and vn2. Equation 3 shows the calculation of the differential between outputs VonullN and VonullP and equations 4 and 5 show the calculation of the amplifier outputs of vn2 and vn1. As shown, equation 3 shows that the differential output ΔVonull is equal to the amplifier outputs vn1 and vn2 as the common mode voltage Vocm cancels. Output vn2 is equal to the gain of amplifier An2 and the offset error of amplifier An2 minus the differential output. Output vn1 is equal to the gain of amplifier An1 and the offset error of amplifier An1.

In equation 6, the differential output voltage ΔVonull may be determined based on equations 3, 4, and 5. Equation 6 shows that the differential output of amplifier ErrAmp2 is based on the offset errors Von1 and Von2 of amplifiers An1 and An2 and the gain of error amplifiers An1 and An2. These values are stored on capacitors C2 during clock phase Φ2. As will be discussed in the next figure, the values stored on capacitors C2 are used to cancel the offset errors Von1 and Von2 during the next clock phase Φ1.

Figure 4:
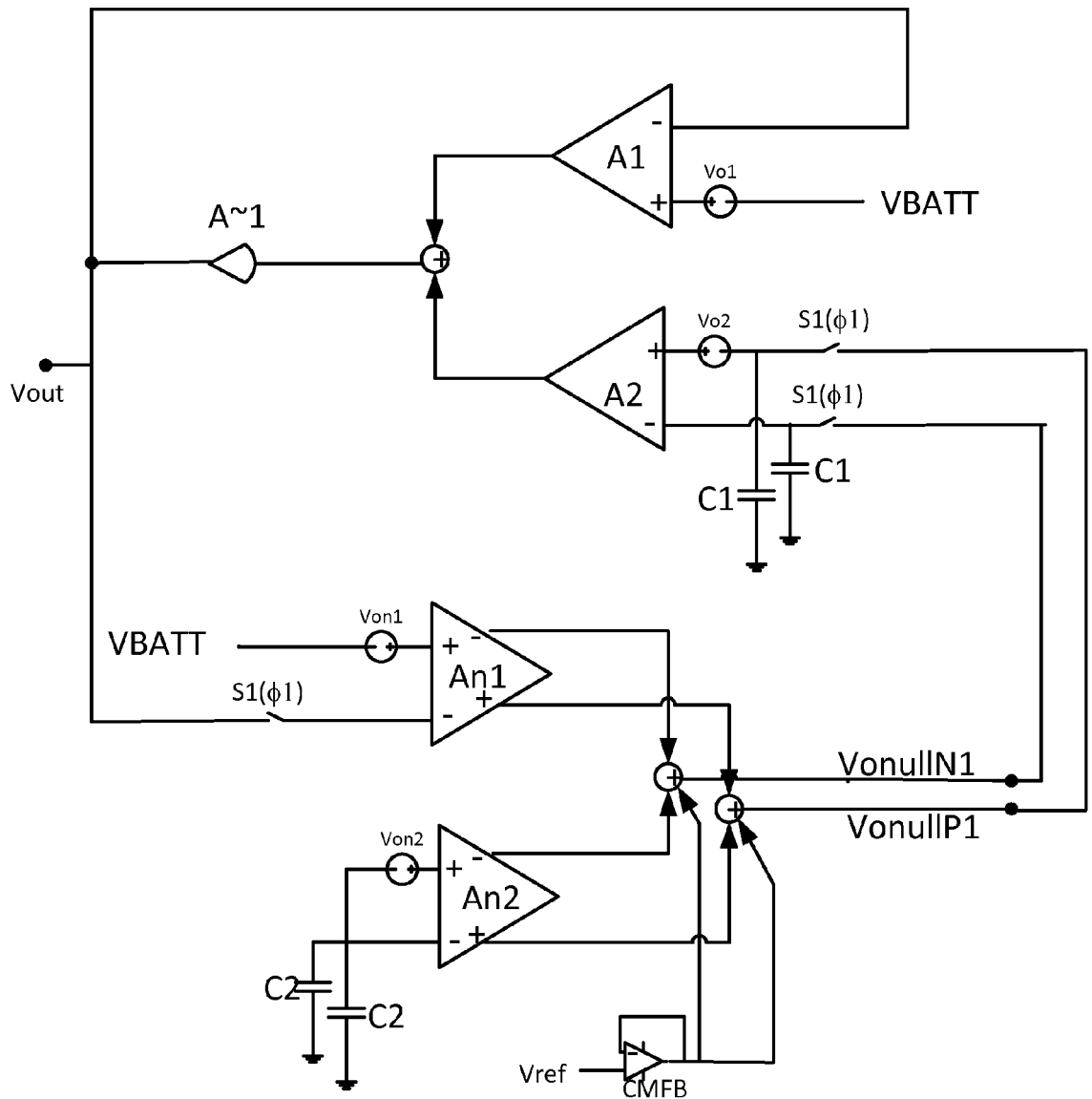
FIG. 4 depicts an example of amplifiers ErrAmp1 (amplifiers A1 and A2) and ErrAmp2 (amplifiers An1 and An2) during clock phase Φ1 according to one embodiment.

FIG. 4 depicts an example of amplifiers ErrAmp1 (amplifiers A1 and A2) and ErrAmp2 (amplifiers An1 and An2) during clock phase Φ1 according to one embodiment. During clock phase Φ1, switches S1 are closed and switches S2 are open. This couples the differential output of ErrAmp2 to a differential input of ErrAmp1. This stores the offset error for amplifier ErrAmp1 on capacitors C1 via amplifier ErrAmp2. Further, the offset error of amplifier ErrAmp2 is canceled via the previous stored values on capacitors C2 in clock phase Φ2 so that the amplifier ErrAmp2 offset error does not affect the storing of the values on capacitors C1. The following will now discuss the offset compensation in more detail.

In amplifier ErrAmp1, the inputs of amplifier A1 are coupled to the output Vout of amplifier ErrAmp1 and the voltage of battery 102. The offset error of amplifier A1 is shown as an offset error voltage Vo1 on one of the inputs of amplifier A1. The differential input of amplifier A2 is coupled to the differential output of amplifier ErrAmp2. Also, the offset error of amplifier A2 is shown as an offset error voltage Vo2 on one of the inputs of amplifier A2.

In this clock phase, amplifier ErrAmp2 stores outputs VonullN and VonullP on capacitors C1. Equation 7 shows the differential voltage across capacitors C1:

$$\Delta V_{onull1} = \quad (7)$$
$$V_{onullP1} - V_{onullN2} = A_{n2} \times \left[ v_{on2} - \frac{A_{n2}}{1+A_{n2}}(v_{on2}) - \frac{A_{n1}}{1+A_{n2}}(v_{on1}) \right] +$$
$$A_{n1} \times (v_{on1} + VBATT - V_{out}) \approx$$
$$(A_{n2} \times v_{on2}) - (A_{n2} \times v_{on2}) - (A_{n1} \times v_{on1}) + (A_{n1} \times v_{on1}) +$$
$$(A_{n1} \times VBATT) - (A_{n1} \times V_{out}) \approx A_{n1} \times (VBATT - V_{out})$$

As shown in equation 7, the differential output voltage of amplifier ErrAmp2 is equal to the gain of amplifier An1 times the difference between the battery voltage VBATT and the output voltage of amplifier ErrAmp1. The offset errors Von1 and Von2 of amplifiers An1 and An2 have been canceled in this case via the values stored on capacitors C2. That is, amplifier An2 cancels offset error Von2 and outputs offset error Von1 (e.g., Von1 times the gain of An2). This outputted offset error Von1 cancels the offset error from amplifier An1.

Now turning to amplifier ErrAmp1, the output Vout of amplifier ErrAmp1 substantially equals the battery voltage VBATT. Equation 8 shows the output of amplifier ErrAmp1 as follows:

$$V_{out} = A_1 \times (VBATT - V_{out} + v_{o1}) + A_2 \times (\Delta V_{onull1} + v_{o2}) = \quad (8)$$
$$A_1 \times (VBATT - V_{out} + v_{o1}) +$$
$$A_2 \times [(A_{n1} \times (VBATT - V_{out}) + v_{o2}] \xrightarrow{yields} V_{out} \times [1 + A_1 +$$
$$A_2 \times A_{n1}] = [VBATT \times (A_1 + A_2 \times A_{n1})] + (A_1 \times v_{o1}) +$$
$$(A_2 \times v_{o2}) \xrightarrow{yields} V_{out} \times \left[1 + \frac{1}{A_1 + A_2 \times A_{n1}}\right] =$$
$$VBATT + \left(\frac{A_1}{A_1 + A_2 \times A_{n1}} \times v_{o1}\right) + \left(\frac{A_2}{A_1 + A_2 \times A_{n1}} \times v_{o2}\right)$$

Because all open loop gain values are large (at least in the order of 1000), equation 8 can be approximated to:

$$V_{out} \approx VBATT + \left(\frac{A_1}{A_1 + A_2 \times A_{n1}} \times v_{o1}\right) + \left(\frac{A_2}{A_1 + A_2 \times A_{n1}} \times v_{o2}\right) \approx VBATT$$

In the above, there is an effective cancellation of the offset errors Vo1 and Vo2, because the gain of amplifier An1 is large, which minimizes the values of Vo1 and Vo2 compared to the value of the battery voltage VBATT. Thus, the gain of amplifier An1 has been used to compensate for the offset errors of amplifiers An1 and An2.

Figure 5:
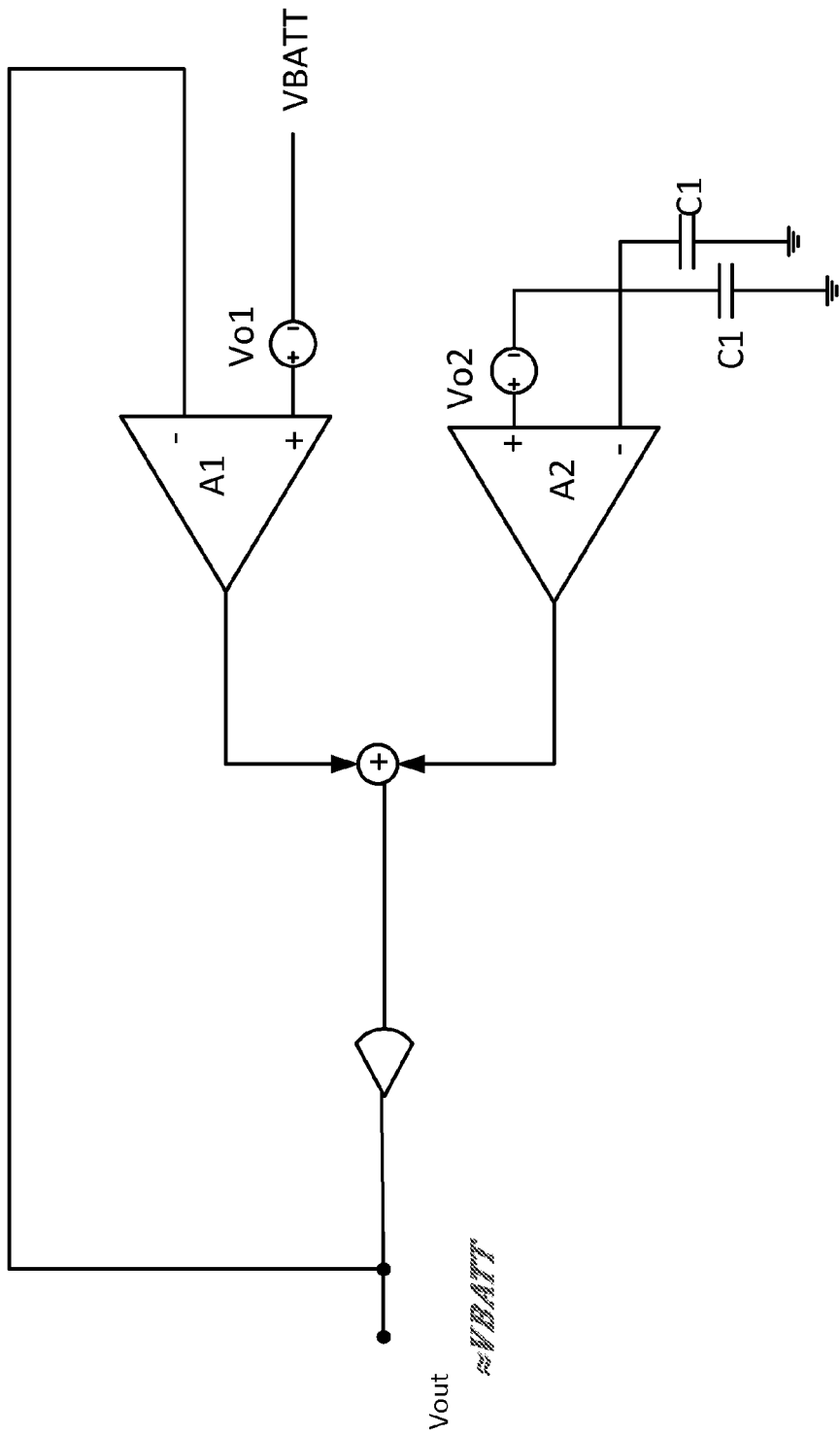
FIG. 5 depicts an example of amplifier ErrAmp1 in clock phase Φ2 according to one embodiment.

In the above discussion of clock phase Φ2, amplifier ErrAmp2 was discussed. In this clock phase, amplifier ErrAmp1 also operates in an open loop gain configuration where the values stored on capacitors C1 are used to compensate for the offset errors of amplifiers A1 and A2. FIG. 5 depicts an example of amplifier ErrAmp1 in clock phase Φ2 according to one embodiment. The inputs of amplifier A1 are coupled to the output Vout of amplifier ErrAmp1 and to the battery voltage VBATT. The offset error voltage Vo1 is also shown at an input of amplifier A1. Also, the inputs of amplifier A2 are coupled to capacitors C1. The offset error voltage Vo2 is also shown at an input of amplifier A2.

As shown in equation 10 below, capacitors C1 hold the differential voltage $\Delta$Vonull1, which is based on the gain of amplifiers A1 and A2 and the offset errors of amplifiers A1 and A2 of Vo1 and Vo2. In equation 7 above, the differential output voltage of amplifier ErrAmp2 is equal to the gain of Amplifier An1 times the difference of VBATT and Vout. In this case, the values stored on capacitors C1 are a function of the gain of amplifiers A1 and A2 and the offset errors Vo1 and Vo2. Equation 10 summarizes these values:

$$\Delta V_{onull1} = \quad (10)$$
$$-\left(\frac{1}{\frac{1}{A_{n1}}+\frac{A_2}{A_1}}\times v_{01}\right) - \left(\frac{1}{\frac{A_1}{A_2 \times A_{n1}}+1}\times v_{02}\right) \approx -\frac{A_1}{A_2}\times v_{01} - v_{02}$$

The following shows the cancellation of the offset errors of amplifiers A1 and A2 based on the values stored in capacitors C1. That is, the offset errors stored on capacitors C1 compensate for the offset error of amplifiers Vo1 and Vo2 during this clock phase. Equation 11 represents the determination of the output voltage Vout of ErrAmp1, which shows the cancellation of offset errors Vo1 and Vo2 as follows:

$$V_{out} = A_1 \times (VBATT - V_{out} + v_{o1}) + A_2 \times (\Delta V_{onull1} + v_{o2}) \quad (11)$$
$$= A_1 \times (VBATT - V_{out} + v_{o1}) +$$
$$A_2 \times \left[-\frac{A_1}{A_2}\times v_{01} - v_{02} + v_{o2}\right]$$

$$V_{out} = A_1 \times (VBATT - V_{out} + v_{o1}) + A_2 \times (\Delta V_{onull1} + v_{o2})$$
$$= A_1 \times (VBATT - V_{out} + v_{o1}) + A_2 \times$$
$$\left[-\frac{A_1}{A_2}\times v_{01} - v_{02} + v_{o2}\right]$$
$$= A_1 \times (VBATT - V_{out}) + (A_1 \times v_{o1} - A_1 \times v_{o1}) \xrightarrow{yields}$$
$$V_{out} \times [1 + A_1]$$
$$A_1 \times VBATT \xrightarrow{yields} V_{out} = \frac{A_1}{1+A_1} \times VBATT \xrightarrow{yields}$$
$$V_{out} \approx VBATT$$

As seen in equation 11, the offset errors Vo1 and Vo2 are cancelled and the output voltage Vout of amplifier ErrAmp1 approximately equals the battery voltage VBATT, Vout≈VBATT. In this case, as seen in equation 10, the values stored on capacitors C1 include offset errors Vo1 and Vo2. The offset error Vo2 stored on capacitor C1 cancels the offset error Vo2 of amplifier A2. Then, amplifier A2 outputs offset error Vo1 amplified by the gain A2 of amplifier A2. Also, amplifier A1 outputs offset error Vo1 amplified by the gain A1 of amplifier A1. The outputs of amplifiers A1 and A2 are of the opposite polarity and thus cancel offset error Vo1 when combined. Accordingly, the offset errors of Vo1 and Vo2 are cancelled in clock phase $\Phi$2 and output voltage Vout substantially equals the battery voltage VBATT.

Figure 6:
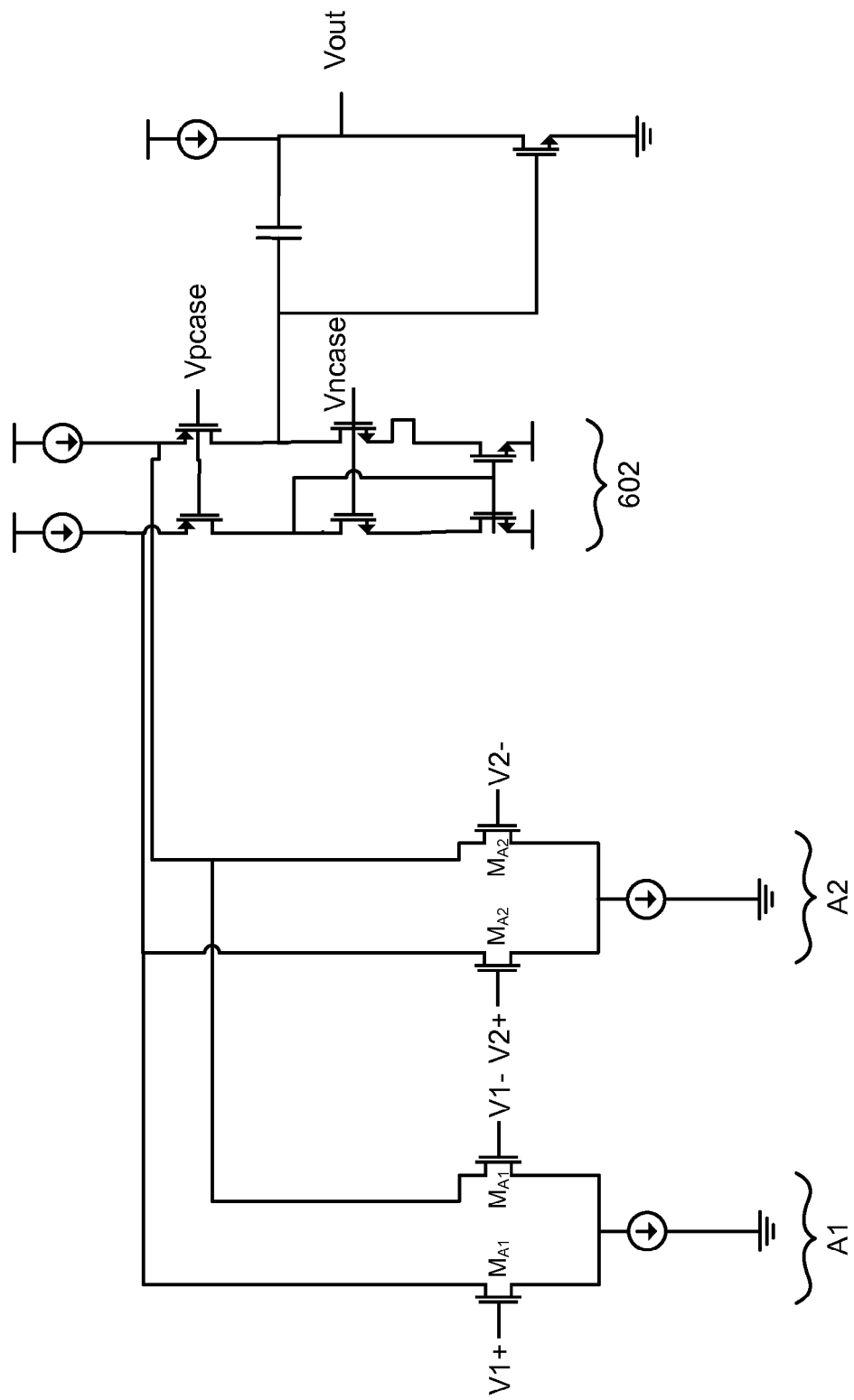
FIGS. 6 and 7 show examples of implementations of ErrAmp1 and ErrAmp2, respectively.
Figure 7:
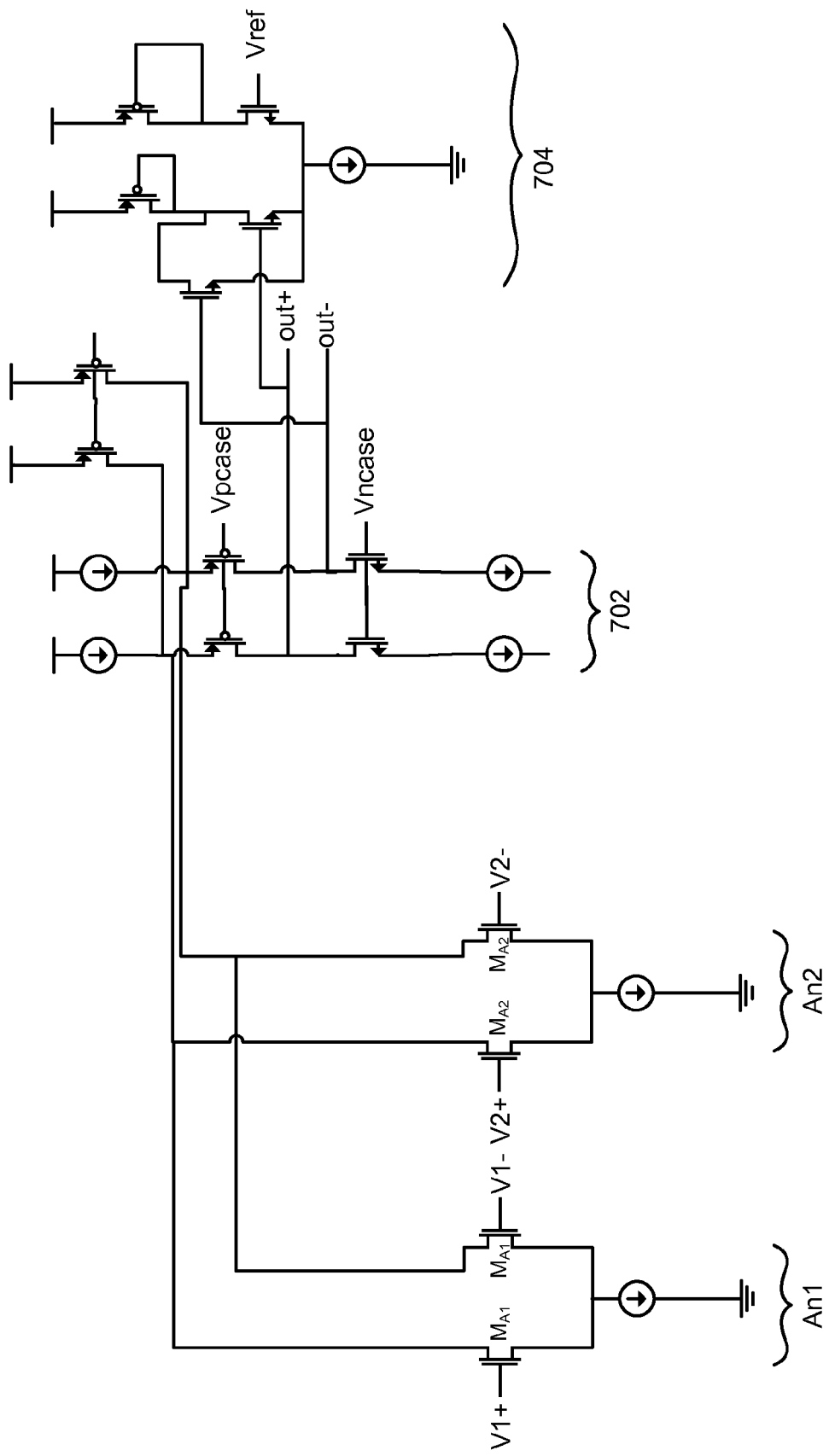

Different implementations of amplifiers ErrAmp1 and ErrAmp2 may be appreciated. FIGS. 6 and 7 show examples of implementations of ErrAmp1 and ErrAmp2, respectively. However, it will be understood that other implementations may be appreciated.

In FIG. 6, differential amplifiers A1 and A2 are shown as a differential pair of transistors $M_{A1}$ and a differential pair of transistors $M_{A2}$. Amplifiers A1 and A2 are coupled to a shared output stage 602. Shared output stage 602 provides a resistor gain that converts a current output of differential amplifiers A1 and A2 into a voltage output. Different variations of shared output stage 602 may be appreciated.

In FIG. 7, differential amplifiers An1 and An2 are shown as a differential pair of transistors $M_{AN2}$ and a differential pair of transistors $M_{AN1}$, respectively. The output of amplifiers An1 and An2 are coupled to a shared output stage 702. Shared output stage 702 also converts a current output of amplifiers An1 and An2 to a voltage, but the output of shared output stage 702 is a differential output Out− and Out+. Also, a common mode feedback circuit 704 is coupled to the differential output and maintains an average value of the differential output at a fixed level based on a voltage Vref, which may be at a different level than the rail voltage, such as ½(Vdd). Using common mode feedback circuit 704, the differential voltage measurement is moved away from the rail voltage or battery voltage VBATT. For example, if the differential voltage measurement is close to the rail, then it might be hard to measure the differential voltage accurately. Thus, setting the common mode differential output voltage to a value, such as ½ of the rail voltage, makes calculating the offset at the average value more accurate. That is, outputs Out+ and Out− are both set at a common mode voltage. Then, the differential of outputs Out+ and Out− can be calculated based on that common mode value that is different from the rail voltage. The common mode voltage drops out while the differential voltage is output on outputs Out+ and Out−. Using the common mode voltage at around half the battery voltage VBATT may simplify the output stage 702.

Figure 8:
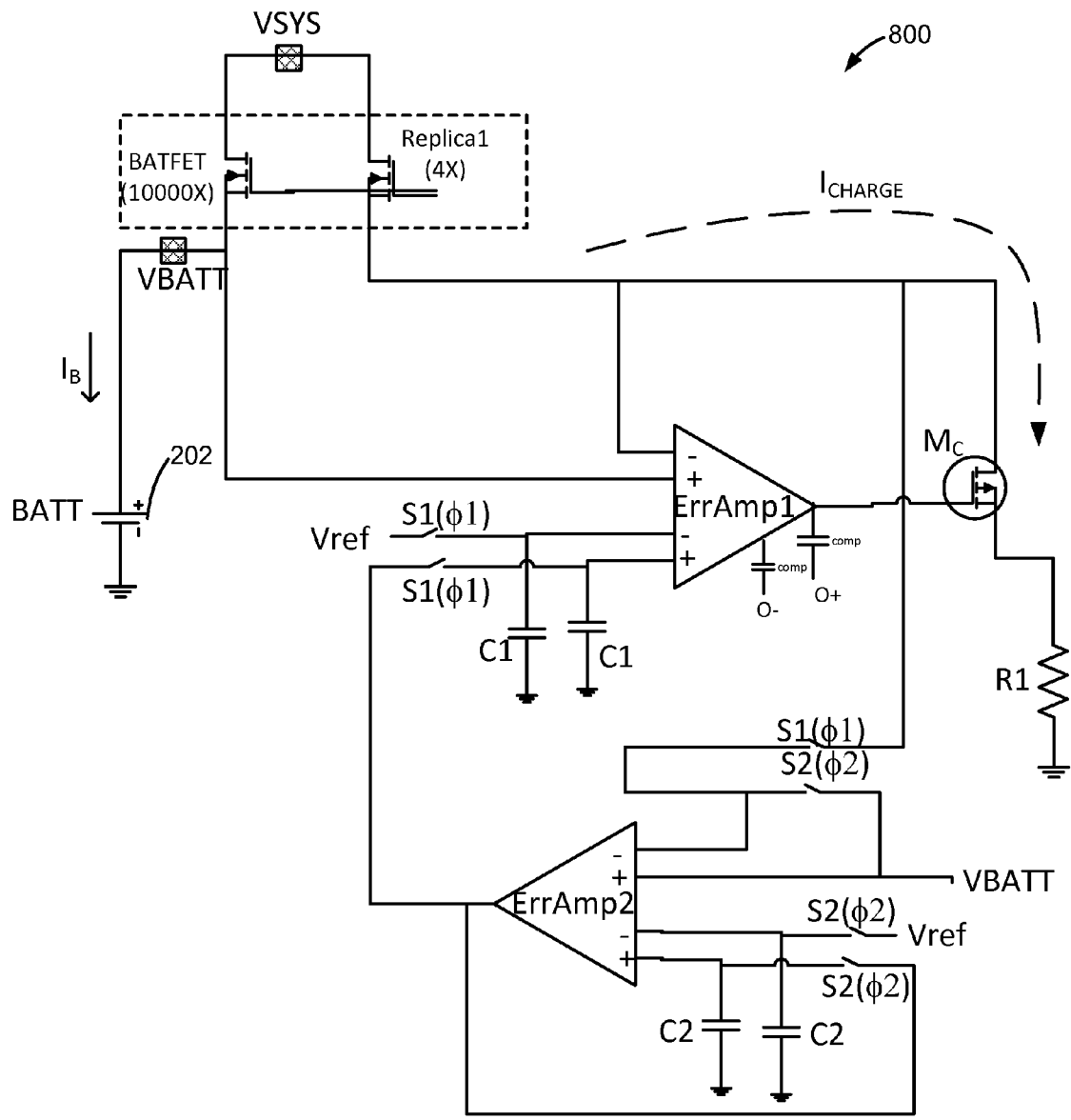
FIG. 8 shows an example of a battery monitoring system using a single output of amplifier ErrAmp2 according to one embodiment.

Although a differential output of amplifier ErrAmp2 was discussed above, a single output may be used. In this case, the differential output voltage at the output of amplifier ErrAmp2 is not performed at the common mode level. This may decrease the accuracy, but offset error compensation is still performed as described above. FIG. 8 shows an example of a battery monitoring system 800 using a single output of amplifier ErrAmp2 according to one embodiment. As shown, a single output of amplifier ErrAmp2 is coupled to amplifier ErrAmp1. Also, the single output of amplifier ErrAmp2 is coupled to an input of amplifier ErrAmp2 in a feedback configuration. Another input of amplifier ErrAmp2 and another input of amplifier ErrAmp1 are coupled to a voltage Vref, which may be a voltage different from the rail voltage.

In clock phase $\Phi$2, the voltage stored across capacitors C2 includes the offset errors Von1 and Von2. In clock phase $\Phi$1, these stored offset errors compensate for the offset errors of amplifier ErrAmp2. Also, in clock phase $\Phi$1, Vout VBATT due to the gain of amplifier An2 (not shown) of amplifier ErrAmp2 substantially canceling the offset errors of amplifier ErrAmp1. Further, in clock phase $\Phi$2, the offset error stored on capacitors C1 cancels the error of amplifier ErrAmp1.

Figure 9:
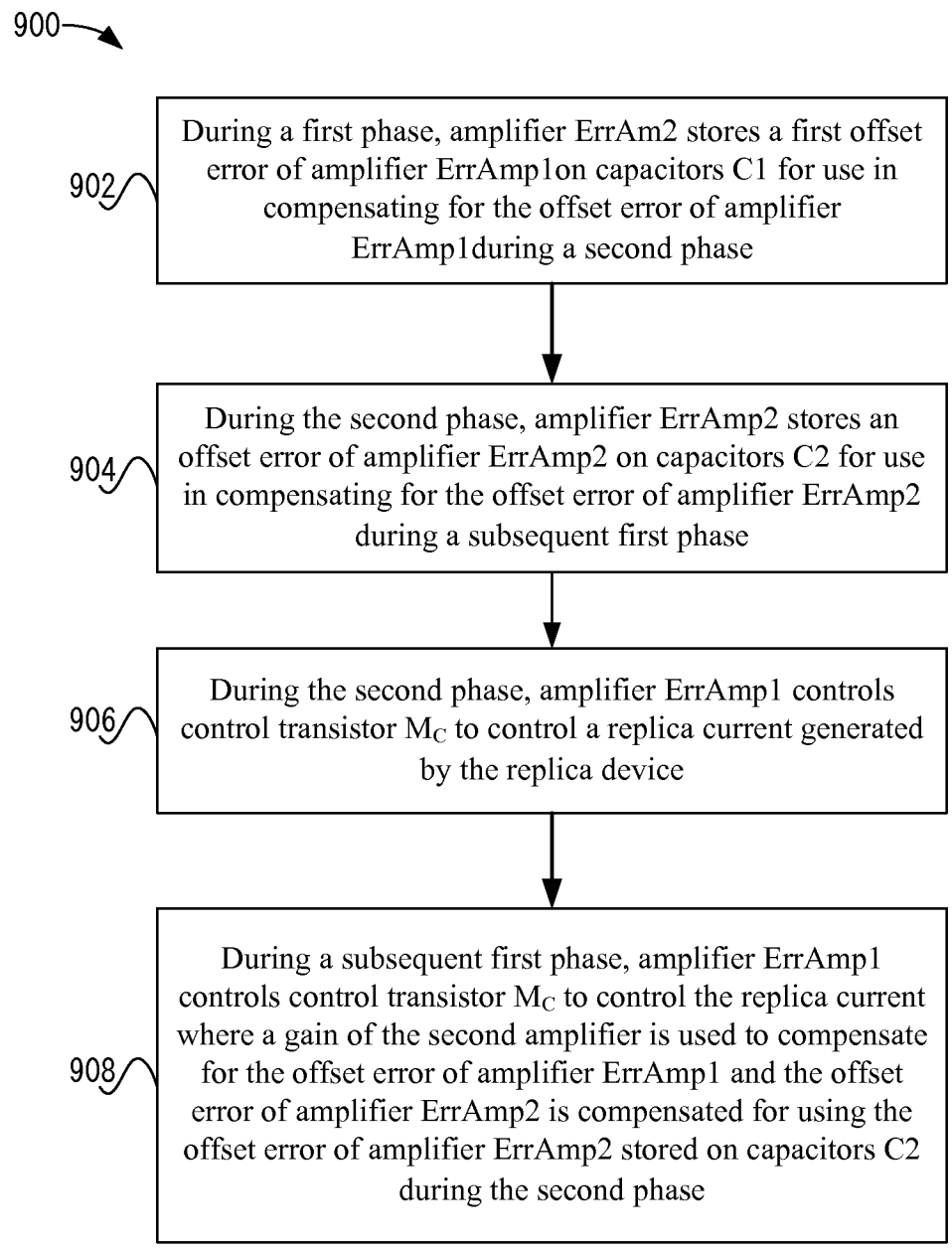
FIG. 9 depicts a simplified flowchart of a method for compensating for offset error according to one embodiment.

FIG. 9 depicts a simplified flowchart 900 of a method for compensating for offset error according to one embodiment. At 902, during a first phase, amplifier ErrAm2 stores a first offset error of amplifier ErrAmp1 on capacitors C1 for use in compensating for the offset error of amplifier ErrAmp1 during a second phase. At 904, during the second phase, amplifier ErrAmp2 stores an offset error of amplifier ErrAmp2 on capacitors C2 for use in compensating for the offset error of amplifier ErrAmp2 during a subsequent first phase. At 906, during the second phase, amplifier ErrAmp1 controls control transistor $M_C$ to control a replica current generated by the replica device. During this phase, the first offset error is compensated for using the first offset error stored during the first phase. At 908, during a subsequent first phase, amplifier ErrAmp1 controls control transistor $M_C$ to control the replica current where a gain of the second amplifier is used to compensate for the offset error of amplifier ErrAmp1 and the offset error of amplifier ErrAmp2 is compensated for using the offset error of amplifier ErrAmp2 stored on capacitors C2 during the second phase.

Temperature Variation Offset

Figure 10:
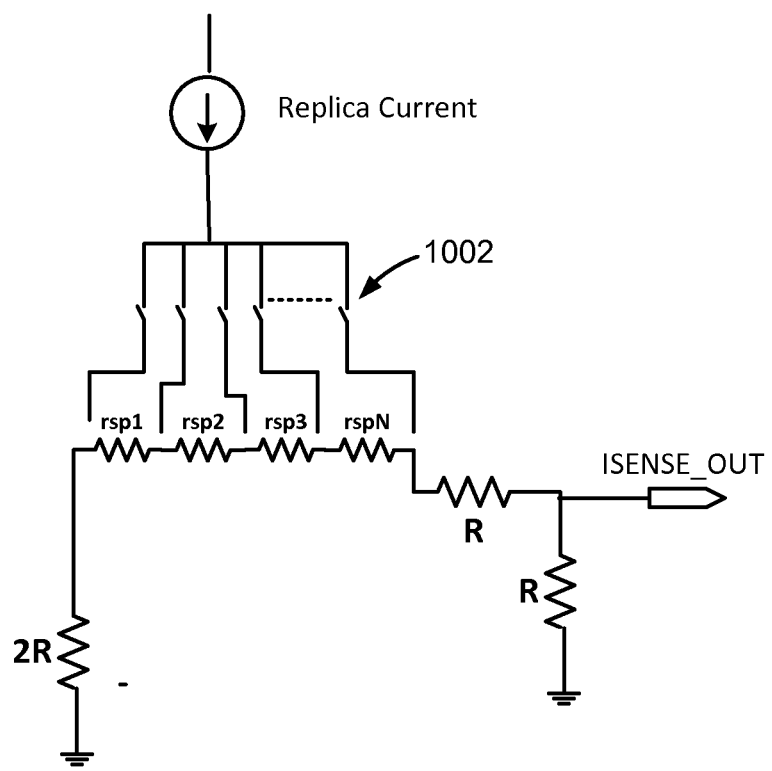
FIG. 10 shows an example implementation of resistor $R_1$ to compensate for temperature variations according to one embodiment.

As discussed above, sensing resistor $R_1$ may be located on chip and thus may be sensitive to temperature variations of the chip. FIG. 10 shows an example implementation of resistor $R_1$ to compensate for temperature variations according to one embodiment. The temperature variations may be compensated for during the current voltage conversion using two types of resistors. The first type of resistor R is a poly resistor with P+ doping having a negative temperature coefficient. The second type of resistors rsp are silicided and having a positive temperature coefficient. The opposite temperature coefficients can be used to compensate for temperature variations.

As shown, the size of resistor rsp (e.g., rsp 1, rsp 2, rsp 3, ... rsp N) can be adjusted via taps 1002. Different tap settings may be used to adjust for the temperature variation by opening or closing different taps to couple various resistors rsp to the replica current. The size of resistors rsp may then compensate for the temperature variation. For example, the size of resistors rsp will determine the final slope of the resistance with respect to temperatures.

Figure 11:
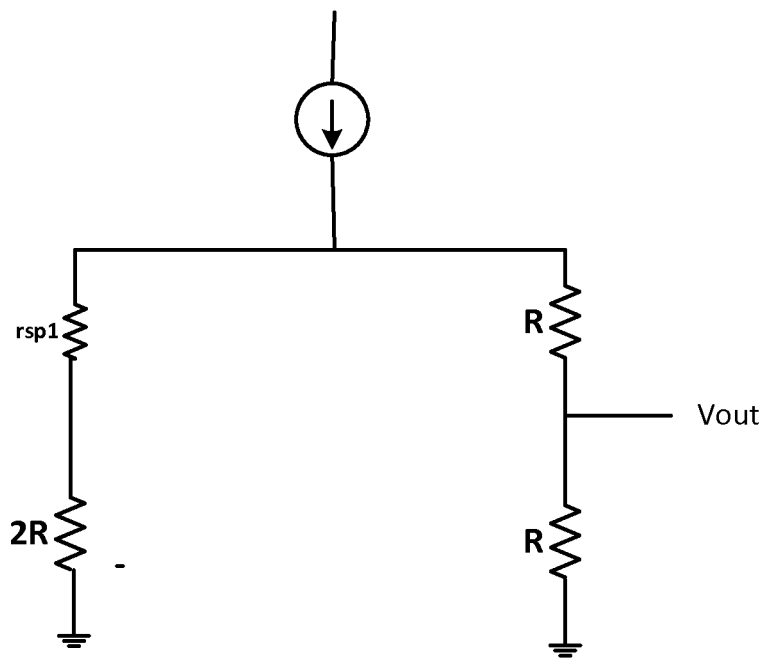
FIG. 11 depicts an example of the temperature correction using resistor rsp1 according to one embodiment.

FIG. 11 depicts an example of the temperature correction using resistor rsp1 according to one embodiment. Resistor RSP in FIG. 10 represents the combination of resistors rsp1-rspN that are coupled to the replica current based on the tap settings. In this case, Vout may be determined as follows:

$$V\text{out} \approx \tfrac{1}{2}(R + \tfrac{1}{2}rsp).$$

As shown, the output voltage Vout across sensing resistor $R_1$ is equal to the resistance of R that is compensated by the resistance of resistor rsp. Although internal resistors are discussed as being used, particular embodiments may also use external resistors that are off-chip and thus do not need temperature compensation.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
    a first amplifier comprising a first differential input, a second differential input, and an output, the first differential input coupled to a replica device and a voltage of a battery and the output coupled to a control device, the replica device configured to generate a replica current of a current flowing through the battery where the first amplifier controls the control device to control the replica current; and
    a second amplifier comprising a third differential input, a fourth differential input, and an output, wherein the second amplifier is configured to compensate for a first offset error of the first amplifier and a second offset error of the second amplifier based on selectively coupling the third differential input to the output of the first amplifier during a first phase, selectively coupling the output of the second amplifier to the second differential input during the first phase, and selectively coupling the output of the second amplifier to the fourth differential input during a second phase.

2. The circuit of claim 1, wherein during the second phase, the second amplifier stores the second offset error of the second amplifier on a first set of storage elements coupled to the fourth differential input of the second amplifier for use in compensating for the second offset error of the second amplifier during the first phase.

3. The circuit of claim 2, wherein during the first phase, the second amplifier stores the first offset error of the first amplifier on a second set of storage elements coupled to the second differential input of the first amplifier for use in compensating for the first offset error of the first amplifier during a subsequent second phase.

4. The circuit of claim 3, wherein a gain of the second amplifier is used to compensate for the first offset error during the first phase.

5. The circuit of claim 1, wherein the second amplifier includes a third amplifier including the third differential input and a fourth amplifier including the fourth differential input, and wherein during the second phase:
    a first input and a second input of the third differential input are coupled to the voltage of the battery, wherein the third amplifier includes a third amplifier offset error of the second offset error, and
    a first input of the fourth differential input is coupled to the output of the second amplifier, wherein the fourth amplifier includes a fourth amplifier offset error of the second offset error.

6. The circuit of claim 5, wherein:
    a first set of storage elements are coupled to the fourth differential input and the output of the second amplifier during the second phase, and
    the first set of storage elements is configured to store the third amplifier offset error and the fourth amplifier offset error during the second phase.

7. The circuit of claim 6, wherein:
    the third amplifier offset error and the fourth amplifier offset error stored during the second phase are used to compensate for the third amplifier offset error and the fourth amplifier offset error during a subsequent first phase.

8. The circuit of claim 5, wherein:
    the first input of the fourth differential input is coupled to a first differential output of the second amplifier, and
    a second input of the fourth differential input is coupled to a second differential output of the second amplifier.

9. The circuit of claim 5, wherein the first amplifier includes a fifth amplifier including the first differential input and a sixth amplifier including the second differential input, and wherein during the first phase:
    a first input of the first differential input is coupled to the output of the first amplifier and a second input of the first differential input is coupled to the voltage of the battery, the fifth amplifier including a fifth amplifier offset error of the first offset error, and a first input of the second differential input is coupled to the output of the second amplifier, the sixth amplifier including a sixth amplifier offset error of the first offset error.

10. The circuit of claim 9, wherein:

a gain of the second amplifier is used to compensate for the fifth amplifier offset error and the sixth amplifier offset error during the first phase.

11. The circuit of claim 10, wherein:

the second set of storage elements are coupled to the second differential input and the output of the second amplifier during the first phase, and the second set of storage elements is configured to store the fifth amplifier offset error and the sixth amplifier offset error during the first phase.

12. The circuit of claim 11, wherein:

the fifth amplifier offset error and the sixth amplifier offset error stored during the second phase are used to compensate for the fifth amplifier offset error and the sixth amplifier offset error during a subsequent second phase.

13. The circuit of claim 9, wherein:

the first input of the second differential input is coupled to a first differential output of the second amplifier, and a second input of the second differential input is coupled to a second differential output of the second amplifier.

14. The circuit of claim 1, wherein the output of the second amplifier is a differential output, the circuit further comprising:

a common mode feedback circuit coupled to the differential output and configured to maintain a common mode portion of the differential output at a fixed value different from the voltage of the battery.

15. The circuit of claim 1, further comprising:

a resistor configured to receive the replica current, wherein a voltage across the resistor is sensed to monitor the voltage across the battery.

16. The circuit of claim 15, wherein the resistor is configured to compensate for temperature changes.

17. The circuit of claim 16, wherein:

the resistor comprises a first set of resistors and a second set of resistors, the first set of resistors have a first temperature coefficient and a second set of resistors have a second temperature coefficient that is opposite of the first temperature coefficient, the first set of resistors are selectively coupled to a plurality of taps, and taps in the plurality of taps selective connect resistors in the first set of resistors to compensate for temperature variations.

18. A method comprising:

during a first phase, storing, by a second amplifier, a first offset error of a first amplifier on a first set of storage elements coupled to a differential input of the first amplifier for use in compensating for the first offset error of the first amplifier during a second phase;

during the second phase, storing, by the second amplifier, a second offset error of the second amplifier on a second set of storage elements coupled to a differential input of the second amplifier for use in compensating for the second offset error of the second amplifier during a subsequent first phase;

during the second phase, controlling, by the first amplifier, a control device to control a replica current generated by the replica device, the replica current being a replica of a current flowing through the battery, wherein the first offset error is compensated for using the first offset error stored during the first phase; and during the subsequent first phase, controlling, by the first amplifier, the control device to control the replica current, wherein a gain of the second amplifier is used to compensate for the first offset error and the second offset error is compensated for using the second offset error stored during the second phase.

19. The method of claim 18, further comprising maintaining a common mode portion of a differential output of the second amplifier at a fixed value different from a voltage of the battery.

20. The method of claim 18, further comprising coupling a resistor configured to receive the replica current to the control device, wherein a voltage across the resistor is sensed to monitor a voltage across the battery and the resistor is configured to compensate for temperature variations.

* * * * *